(12) United States Patent
Wang et al.

(10) Patent No.: US 11,437,087 B2
(45) Date of Patent: Sep. 6, 2022

(54) METHOD AND APPARATUS FOR ACCUMULATING AND STORING RESPECTIVE ACCESS COUNTS OF WORD LINES IN MEMORY MODULE

(71) Applicant: Piecemakers Technology, Inc., Hsinchu (TW)

(72) Inventors: Ming-Hung Wang, Hsinchu (TW); Chun-Peng Wu, Hsinchu (TW)

(73) Assignee: Piecemakers Technology, Inc., Hsinchu (TW)

( * ) Notice: Subject to any disclaimer, the term of this patent is extended or adjusted under 35 U.S.C. 154(b) by 0 days.

(21) Appl. No.: 16/919,036

(22) Filed: Jul. 1, 2020

(65) Prior Publication Data

US 2021/0158853 A1 May 27, 2021

Related U.S. Application Data (60) Provisional application No. 62/939,693, filed on Nov. 25, 2019.

(51) Int. Cl.

| G11C 11/40 | (2006.01) |
|---|---|
| G11C 11/408 | (2006.01) |
| G11C 11/4094 | (2006.01) |
| G11C 11/4076 | (2006.01) |
| G11C 7/10 | (2006.01) |

(52) U.S. Cl.
CPC .......... G11C 11/4085 (2013.01); G11C 7/106 (2013.01); G11C 7/1057 (2013.01); G11C 7/1084 (2013.01); G11C 7/1087 (2013.01); G11C 11/4076 (2013.01); G11C 11/4094 (2013.01)

(58) Field of Classification Search
CPC . G11C 11/4085; G11C 7/1084; G11C 7/1087; G11C 7/1057; G11C 11/4076; G11C 11/4094; G11C 7/106
See application file for complete search history.

(56) References Cited

U.S. PATENT DOCUMENTS

| 5,777,921 | A | 7/1998 | Kata | |
|---|---|---|---|---|
| 9,412,432 | B2 | 8/2016 | Narui | |
| 2016/0078911 | A1* | 3/2016 | Fujiwara | G11C 7/109 365/189.2 |
| 2020/0251158 | A1* | 8/2020 | Shore | G11C 11/408 |
| 2021/0057022 | A1* | 2/2021 | Jenkinson | G11C 11/4087 |

OTHER PUBLICATIONS

E. Lee, I. Kang, S. Lee, G. E. Suh and J. H. Ahn, "TWiCe: Preventing Row-hammering by Exploiting Time Window Counters," 2019 ACM/IEEE 46th Annual International Symposium on Computer Architecture (ISCA), Phoenix, AZ, USA, 2019, pp. 385-396. (Year: 2019).*

* cited by examiner

*Primary Examiner* — Ajay Ojha
(74) *Attorney, Agent, or Firm* — Winston Hsu (57) ABSTRACT

A method and apparatus for accumulating and storing respective access counts of a plurality of word lines in a memory module are provided. The method may include: within a memory bank positioned in the memory module, providing a plurality of extraordinary storage cells coupled to the plurality of word lines; and utilizing the plurality of extraordinary storage cells to accumulate and store the respective access counts of the plurality of word lines, wherein multiple sets of extraordinary storage cells in the plurality of extraordinary storage cells correspond to the plurality of word lines, respectively.

11 Claims, 7 Drawing Sheets

METHOD AND APPARATUS FOR ACCUMULATING AND STORING RESPECTIVE ACCESS COUNTS OF WORD LINES IN MEMORY MODULE

CROSS REFERENCE TO RELATED APPLICATIONS

This application claims the benefit of U.S. provisional application No. 62/939,693, which was filed on Nov. 25, 2019, and is included herein by reference.

BACKGROUND OF THE INVENTION

1. Field of the Invention

The present invention is related to memory management, and more particularly, to a method and apparatus for accumulating and storing respective access counts of a plurality of word lines in a memory module, for example, with aid of partial memory architecture of the memory module.

2. Description of the Prior Art

According to the related art, a memory such as a Dynamic Random Access Memory (DRAM) may be arranged to store user data. When detecting word line access counts is required, some problems may occur. For example, as there may be thousands of word lines in the memory, implementing thousands of counters respectively corresponding to the thousands of word lines typically increases the associated costs. More particularly, the thousands of counters may occupy a certain percentage of a chip area of a chipset. As the storage capacity may become greater and greater due to the progress of the development, the total number of word lines may increase, causing the problem to become even worse. Thus, a novel method and associated architecture are needed for solving the problems without introducing any side effect or in a way that is less likely to introduce a side effect.

SUMMARY OF THE INVENTION

It is therefore an objective of the present invention to provide a method and apparatus for accumulating and storing respective access counts of a plurality of word lines in a memory module (e.g. a DRAM), in order to solve the above-mentioned problems.

At least one embodiment of the present invention provides an apparatus for accumulating and storing respective access counts of a plurality of word lines in a memory module. The apparatus may comprise a memory bank that is positioned in the memory module, and the memory bank may comprise a plurality of extraordinary storage cells coupled to the plurality of word lines. The memory bank may be arranged to store data for a host system, and the plurality of extraordinary storage cells may be arranged to accumulate and store the respective access counts of the plurality of word lines, wherein multiple sets of extraordinary storage cells in the plurality of extraordinary storage cells may correspond to the plurality of word lines, respectively. More particularly, the memory bank may further comprise a counter coupled to the plurality of extraordinary storage cells, and a word line access count control unit comprising at least one control circuit (e.g. one or more control circuits), where the word line access count control unit is coupled to the counter. The counter may be arranged to perform counting, and the word line access count control unit may be arranged to control operations of the apparatus. For example, in response to any word line of the plurality of word lines being accessed, the word line access count control unit controls the counter to read out a set of bit information in a set of extraordinary storage cells at said any word line; the counter updates a counter value indicated by the set of bit information to generate an updated counter value; and the word line access count control unit triggers writing a set of updated bit information indicating the updated counter value back to the set of extraordinary storage cells at said any word line, to be an updated value of an access count of said any word line.

In addition to the above apparatus, the present invention also provides a method for accumulating and storing respective access counts of a plurality of word lines in a memory module. The method may comprise: within a memory bank positioned in the memory module, providing a plurality of extraordinary storage cells coupled to the plurality of word lines; and utilizing the plurality of extraordinary storage cells to accumulate and store the respective access counts of the plurality of word lines, wherein multiple sets of extraordinary storage cells in the plurality of extraordinary storage cells correspond to the plurality of word lines, respectively. More particularly, the method may further comprise: in response to any word line of the plurality of word lines being accessed, reading out a set of bit information in a set of extraordinary storage cells at said any word line, wherein the memory bank positioned in the memory module comprises the plurality of extraordinary storage cells comprising the set of extraordinary storage cells; utilizing a counter to update a counter value indicated by the set of bit information to generate an updated counter value; and writing a set of updated bit information indicating the updated counter value back to the set of extraordinary storage cells at said any word line, to be an updated value of an access count of said any word line.

The present invention method and associated apparatus can guarantee that the memory module can operate properly in various situations, and can concurrently generate or update the word line access counts during daily use of the memory module. In addition, implementing the embodiments of the present invention will not significantly increase the cost. Therefore, the related art problems can be solved, and the overall cost will not increase too much. In comparison with the related art, the present invention method and associated apparatus can enhance overall performance without introducing any side effect or in a way that is less likely to introduce a side effect.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
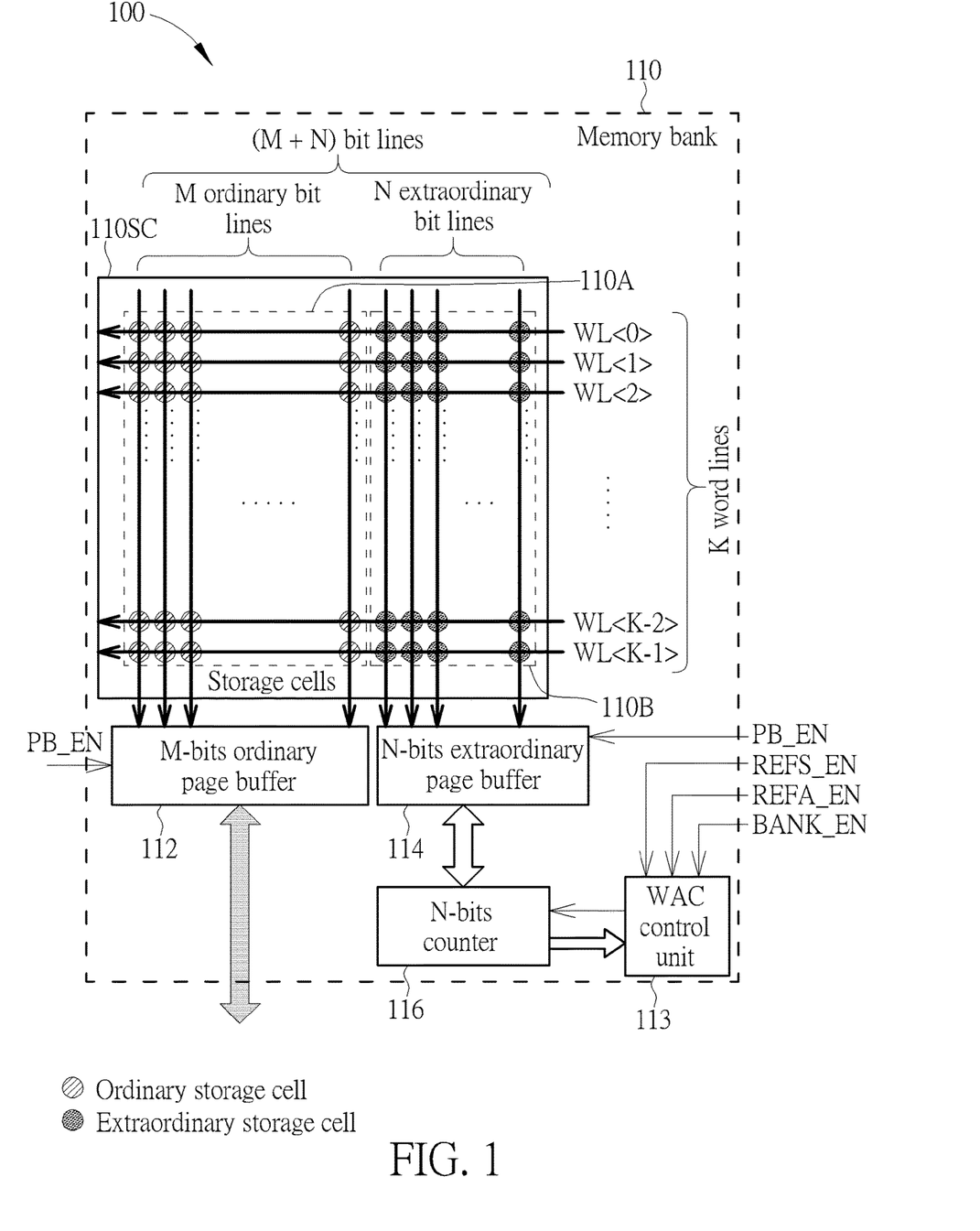
FIG. 1 is a diagram of an apparatus for accumulating and storing respective access counts of a plurality of word lines in a memory module according to an embodiment of the present invention.

FIG. 1 is a diagram of an apparatus for accumulating and storing respective access counts of a plurality of word lines in a memory module 100 (e.g. a DRAM) according to an embodiment of the present invention, where the apparatus may comprise at least one portion (e.g. a portion or all) of the memory module 100. For example, the apparatus may comprise partial memory architecture of the memory module 100. For another example, the apparatus may comprise a combination of the partial memory architecture and associated control mechanism. For yet another example, the apparatus may comprise the whole of the memory module 100.

As shown in FIG. 1, the memory module 100 may comprise at least one memory bank (e.g. one or more memory banks) such as a memory bank 110. The memory bank 110 may comprise a plurality of storage cells 110SC such as (K*(M+N)) storage cells comprising (K*M) ordinary storage cells 110A and (K*N) extraordinary storage cells 110B (e.g. K, M and N may represent positive integers, respectively), and comprise a plurality of bit lines such as (M+N) bit lines comprising M ordinary bit lines and N extraordinary bit lines, and may further comprise an ordinary page buffer such as an M-bits ordinary page buffer 112, an extraordinary page buffer such as an N-bits extraordinary page buffer 114, a counter such as an N-bits counter 116, and a word line (WL) access count (WAC) control unit 113 (which may be referred to as the WAC control unit 113 for brevity) comprising at least one control circuit (e.g. one or more control circuits), where the plurality of storage cells 110SC (e.g. the (K*M) ordinary storage cells 110A and the (K*N) extraordinary storage cells 110B) are coupled to the plurality of word lines such as K word lines {WL<0>, WL<1>, WL<2>, WL<K-2>, WL<K-1>} and the plurality of bit lines such as the (M+N) bit lines, respectively, and the M ordinary bit lines and the N extraordinary bit lines are coupled to the (K*M) ordinary storage cells 110A and the (K*N) extraordinary storage cells 110B, respectively. The (K*M) ordinary storage cells 110A may be located at the intersections of the K word lines {WL<0>, WL<1>, ..., WL<K-1>} and the M ordinary bit lines, respectively, and the (K*N) extraordinary storage cells 110B may be located at the intersections of the K word lines {WL<0>, WL<1>, ..., WL<K-1>} and the N extraordinary bit lines, respectively. In addition, the ordinary page buffer and the extraordinary page buffer may be implemented by way of sense amplifiers respectively coupled to the associated bit lines. For example, the ordinary page buffer such as the M-bits ordinary page buffer 112 may comprise multiple sense amplifiers (e.g. bit line sense amplifiers (BLSAs)) electrically connected to the M ordinary bit lines, respectively, and the extraordinary page buffer such as the N-bits extraordinary page buffer 114 may comprise multiple sense amplifiers (e.g. BLSAs) electrically connected to the N extraordinary bit lines, respectively.

The memory bank 110 may be arranged to store data for a host system (not shown), and the memory module 100 comprising the memory bank 110 may be installed in the host system. Examples of the host system may include, but are not limited to: a multifunctional mobile phone, a tablet computer, and a personal computer such as a desktop computer and a laptop computer. In addition, the counter such as the N-bits counter 116 may be arranged to perform counting, and the WAC control unit 113 may be arranged to control operations of the apparatus mentioned above. More particularly, at least one portion (e.g. a portion or all) of the (K*M) ordinary storage cells 110A may be arranged to store the data (e.g. system data of the host system, user data of a user of the host system, etc.), and the (K*N) extraordinary storage cells 110B may be arranged to accumulate and store the respective access counts of the plurality of word lines (e.g. the K word lines {WL<0>, WL<1>, ..., WL<K-1>}).

According to this embodiment, the M ordinary bit lines and the K word lines {WL<0>, WL<1>, ..., WL<K-1>} may be arranged to control access of the (K*M) ordinary storage cells 110A, and the N extraordinary bit lines and the K word lines {WL<0>, WL<1>, ..., WL<K-1>} may be arranged to control access of the (K*N) extraordinary storage cells 110B, where the memory module 100 may obtain the data from the (K*M) ordinary storage cells 110A through the ordinary page buffer such as the M-bits ordinary page buffer 112, for being output to the host system, and may obtain the respective access counts of the plurality of word lines from the (K*N) extraordinary storage cells 110B through the extraordinary page buffer such as the N-bits extraordinary page buffer 114, for being updated or being output to the host system. As shown in FIG. 1, multiple sets of extraordinary storage cells in the (K*N) extraordinary storage cells 110B, such as K rows of extraordinary storage cells, may correspond to the plurality of word lines such as the K word lines {WL<0>, WL<1>, ..., WL<K-1>}, respectively, and may operate in response to accessing of K rows of ordinary storage cells in the (K*M) ordinary storage cells 110A (e.g. the accessing through the K word lines {WL<0>, WL<1>, WL<2>, ..., WL<K-2>, WL<K-1>}), respectively. Based on the architecture shown in FIG. 1, the memory module 100 can operate properly in various situations, and can concurrently generate or update the respective access counts of the plurality of word lines during daily use of the memory module 100, and more particularly, generate or update an access count of an active word line concurrently with the accessing of a certain row of ordinary storage cells at the active word line.

In comparison with the (K*M) ordinary storage cells 110A, the M ordinary bit lines, and the ordinary page buffer such as the M-bits ordinary page buffer 112 corresponding to ordinary operations (e.g. operations of storing, accessing, and buffering the data), the (K*N) extraordinary storage cells 110B, the N extraordinary bit lines, and the extraordinary page buffer such as the N-bits extraordinary page buffer 114 may correspond to extraordinary operations.

Figure 2:
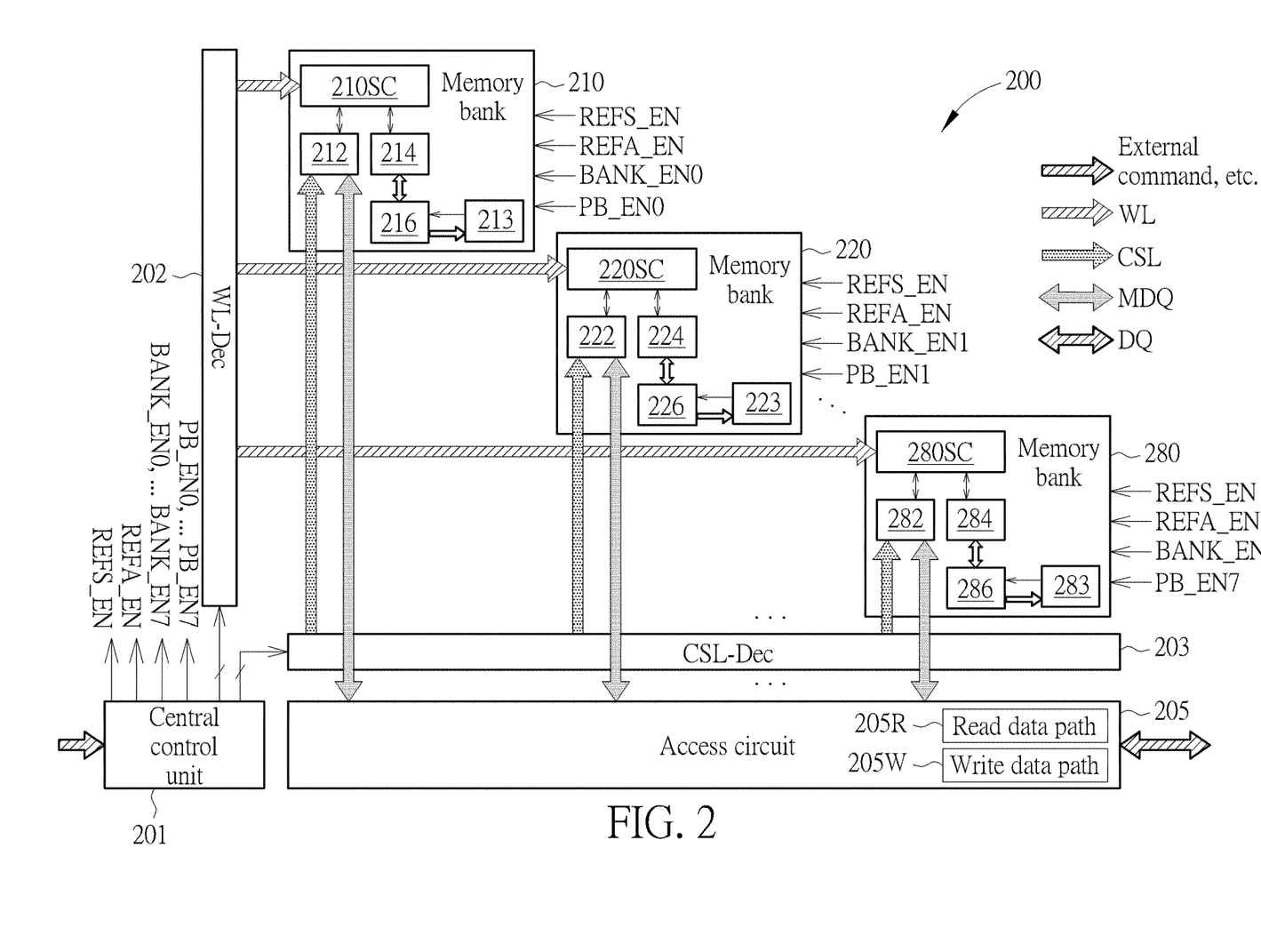
FIG. 2 illustrates a memory module adopting the architecture of the memory module shown in FIG. 1 according to an embodiment of the present invention.

As shown in FIG. 1, the WAC control unit 113 may receive a set of enable signal such as a bank-enable signal BANK_EN, an auto-refresh-enable signal REFA_EN and a self-refresh-enable signal REFS EN, for selectively enabling (or disabling) the memory bank 110, the auto-refresh mode of the memory bank 110 and the self-refresh mode of the memory bank 110, respectively, and the ordinary page buffer such as the M-bits ordinary page buffer 112 and the extraordinary page buffer such as the N-bits extraordinary page buffer 114 may receive a same enable signal such as a page-buffer-enable signal PB_EN, for selectively enabling (or disabling) these page buffers, where the counter such as the N-bits counter 116 may operate under control of the WAC control unit 113. For better comprehension, FIG. 2 illustrates a memory module 200 adopting the architecture of the memory module 100 shown in FIG. 1 according to an embodiment of the present invention. For example, the memory bank 110 shown in FIG. 1 may represent any memory bank (e.g. each memory bank) of multiple memory banks of the memory module 200, the bank-enable signal BANK_EN shown in FIG. 1 may represent a corresponding bank-enable signal such as one of the bank-enable signals BANK_EN0, BANK_EN1, ... and BANK_EN7 shown in FIG. 2, for selectively enabling (or disabling) the aforementioned any memory bank of the multiple memory banks of the memory module 200, and the page-buffer-enable signal PB_EN shown in FIG. 1 may represent a corresponding page-buffer-enable signal such as one of the page-buffer-enable signals PB_EN0, PB_EN1, and PB_EN7 shown in FIG. 2, for selectively enabling (or disabling) corresponding ordinary and extraordinary page buffers in the aforementioned any memory bank. Some implementation details of the memory module 200 may be described later.

Figure 3:
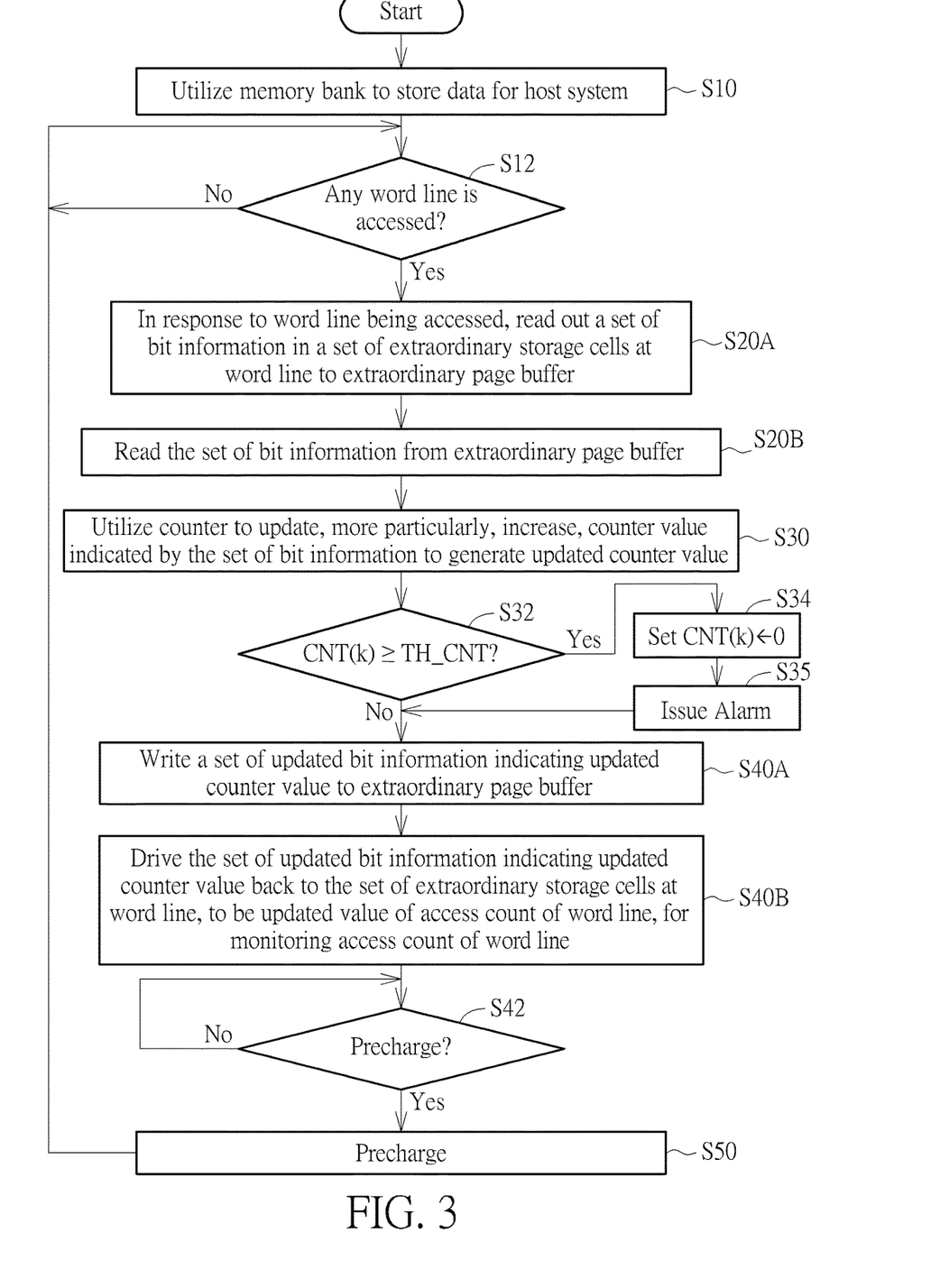
FIG. 3 is a working flow of a method for accumulating and storing respective access counts of a plurality of word lines in a memory module according to an embodiment of the present invention.

FIG. 3 is a working flow of a method for accumulating and storing respective access counts of a plurality of word lines in a memory module according to an embodiment of the present invention. The method may be applied to the architecture shown in FIG. 1, and may be described as follows.

In Step S10, the memory module 100 may utilize the memory bank 110 to store the data (e.g. the system data, the user data, etc.) for the host system.

In Step S12, the memory module 100 (e.g. the WAC control unit 113) may determine whether any word line of the plurality of word lines (e.g. a word line WL<k> of the K word lines {WL<0>, WL<1>, ..., WL<K−1>}) is accessed, where "k" may represent an integer falling within the interval [0, K−1]. If Yes, Step S20A is entered; if No, Step S12 is re-entered. This word line may be taken as an example of the active word line mentioned above.

In Step S20A, in response to the aforementioned any word line of Step S12 (e.g. the word line WL<k>) being accessed, the memory module 100 may read out a set of bit information (e.g. N bits of word line access count data) in a set of extraordinary storage cells at this word line (e.g. the $(k+1)^{th}$ row of extraordinary storage cells at the word line WL<k>) through the N extraordinary bit lines to the extraordinary page buffer such as the N-bits extraordinary page buffer 114. For example, in response to this word line (e.g. the word line WL<k>) being accessed, the extraordinary page buffer such as the N-bits extraordinary page buffer 114 may read out the set of bit information in the set of extraordinary storage cells at this word line through the N extraordinary bit lines. During reading out the set of bit information (e.g. the N bits of word line access count data), as this word line (e.g. the word line WL<k>) is active, the cell signals carrying the set of bit information may be transmitted from the set of extraordinary storage cells at this word line to the N extraordinary bit lines by charge sharing, and the set of bit information may be latched by the extraordinary page buffer such as the N-bits extraordinary page buffer 114.

In Step S20B, the WAC control unit 113 may utilize the counter such as the N-bits counter 116 to read the set of bit information (e.g. the N bits of word line access count data) from the extraordinary page buffer such as the N-bits extraordinary page buffer 114.

In Step S30, the WAC control unit 113 may utilize the counter such as the N-bits counter 116 to update, more particularly, increase, a counter value CNT(k) indicated by the set of bit information (e.g. N bits of word line access count data) to generate an updated counter value CNT'(k) of the counter value CNT(k), for example, increase the counter value CNT(k) with a predetermined increment such as one (e.g. CNT'(k)=CNT(k)+1), but the present invention is not limited thereto. For better comprehension, the ordinary page buffer such as the M-bits ordinary page buffer 112 is coupled to the (K*M) ordinary storage cells 110A through the M ordinary bit lines, and the extraordinary page buffer such as the N-bits extraordinary page buffer 114 is coupled to the (K*N) extraordinary storage cells 110B through the N extraordinary bit lines. For example, the extraordinary page buffer such as the N-bits extraordinary page buffer 114 may latch the set of bit information, for being loaded into the counter such as the N-bits counter 116 to be the counter value CNT(k).

In Step S32, the WAC control unit 113 may check whether the counter value CNT(k) reaches (e.g. is greater than or equal to) a predetermined counter value threshold TH_CNT (labeled "CNT(k)≥TH_CNT" for brevity). If Yes, Step S34 is entered; if No, Step S40A is entered. For example, the predetermined counter value threshold TH_CNT can be a predetermined value such as a maximum allowable value CNT_MAX (e.g. $(2^N-1)$), but the present invention is not limited thereto. According to some embodiments, the predetermined counter value threshold TH_CNT may vary, and more particularly, may equal to any of some other values. For example, the WAC control unit 113 may set the predetermined counter value threshold TH_CNT according to default setting or user setting in advance.

In Step S34, the WAC control unit 113 may reset (e.g. clear) the counter value CNT(k) to be an initial value such as zero (labeled "Set CNT(k)←0" for better comprehension), for generating the updated counter value CNT'(k), where the updated counter value CNT'(k) may become zero in this step.

In Step S35, the WAC control unit 113 may issue (e.g. generate or output, more particularly, generate and output) an alarm, where Step S40A is entered afterward. For example, the memory module 100 may notify the host system of the event of the counter value CNT(k) reaching the predetermined counter value threshold TH_CNT, but the present invention is not limited thereto. According to some embodiments, the WAC control unit 113 may further generate a notification signal corresponding to the word line WL<k>, to indicate that the word line WL<k> is the word line involved with the alarm, for the memory module 100 to notify the host system.

In Step S40A, the WAC control unit 113 may utilize the counter such as the N-bits counter 116 to write a set of updated bit information (e.g. N bits of updated word line access count data) indicating the updated counter value CNT'(k) to the extraordinary page buffer such as the N-bits extraordinary page buffer 114, for writing the set of updated bit information back to the set of extraordinary storage cells at the aforementioned any word line.

In Step S40B, the memory module 100 may drive the set of updated bit information (e.g. the N bits of updated word line access count data) indicating the updated counter value CNT'(k) back to the set of extraordinary storage cells at the aforementioned any word line, such as the $(k+1)^{th}$ row of extraordinary storage cells at the word line WL<k>, through the N extraordinary bit lines, to be an updated value of an access count of this word line (e.g. the word line WL<k>), for monitoring the access count of this word line, thereby accumulating and storing the respective access counts of the plurality of word lines. For example, the extraordinary page buffer such as the N-bits extraordinary page buffer 114 may drive the set of updated bit information indicating the updated counter value CNT'(k) back to the set of extraordinary storage cells at this word line through the N extraordinary bit lines, to be the updated value of the access count of this word line. More particularly, the counter such as the N-bits counter 116 may drive or output the set of updated bit information to the extraordinary page buffer such as the N-bits extraordinary page buffer 114, for writing the set of updated bit information back to the set of extraordinary storage cells at this word line. During writing the set of updated bit information (e.g. the N bits of updated word line access count data), as this word line (e.g. the word line WL<k>) is active, the cell signals carrying the set of updated bit information may be transmitted from the N extraordinary bit lines to the set of extraordinary storage cells at this word line. For better comprehension, updating (e.g. accumulating) the access count of the word line WL<k> through the operations of Steps S20A, S20B, S30, S40A and S40B may be express as follows:

CNT(k)++;

but the present invention is not limited thereto.

In Step S42, the memory module 100 may determine whether to precharge the memory bank 100. If Yes, Step S50 is entered; if No, Step S42 is re-entered. For example, when the memory module 100 receives a predetermined external command such as a precharge command PRE from the host system, the memory module 100 may determine that precharging the memory bank 100 is required.

In Step S50, the memory module 100 may precharge the memory bank 100.

Please note that the counter such as the N-bits counter 116 may be shared among the plurality of word lines such as the K word lines {WL<0>, WL<1>, ..., WL<K−1>}, and may be shared among respective counting operations of the respective access counts of the plurality of word lines. For example, as one or more loops comprising Steps S12, S20A, S20B, S30, S40A, S40B, S50, etc. may be executed for the active word line such as any of the plurality of word lines (e.g. the K word lines {WL<0>, WL<1>, ..., WL<K−1>}), the apparatus may accumulate and store the respective access counts of the plurality of word lines, such as respective counter values {CNT(0), CNT(1), CNT(K−1)} of the K word lines {WL<0>, WL<1>, ..., WL<K−1>}), where the counter values {CNT(0), CNT(1), ..., CNT(K−1)} may be regarded as the latest accumulated values of the K access counts of the K word lines {WL<0>, WL<1>, ..., WL<K−1>}, respectively.

For better comprehension, the method may be illustrated with the working flow shown in FIG. 3, but the present invention is not limited thereto. According to some embodiments, one or more steps may be added, deleted, or changed in the working flow shown in FIG. 3.

According to some embodiments, as long as implementation of the present invention will not be hindered, the way of updating the counter value CNT(k) in Step S30 may vary, where some associated operations may be changed correspondingly, For example, the operation of updating the counter value CNT(k) indicated by the set of bit information (e.g. the N bits of word line access count data) to generate the updated counter value CNT'(k) of the counter value CNT(k) may be performed by decreasing the counter value CNT(k) with a predetermined decrement such as one (e.g. CNT'(k)=CNT(k)−1). More particularly, the predetermined counter value threshold TH_CNT can be another predetermined value such as zero. As a result, the WAC control unit 113 may check whether the counter value CNT(k) reaches (e.g. is equal to) the predetermined counter value threshold TH_CNT such as zero in Step S32 (e.g. "CNT(k) ≥TH_CNT" may be replaced with "CNT(k)==TH_CNT" for better comprehension). If Yes, Step S34 is entered; if No, Step S40A is entered. In addition, the WAC control unit 113 may reset (e.g. clear) the counter value CNT(k) to be the initial value such as the maximum allowable value CNT_MAX (e.g. ($2^N$−1)) in Step S34 (e.g. "Set CNT(k)←0" may be replaced with "Set CNT(k)←CNT_MAX" for better comprehension). For brevity, similar descriptions for these embodiments are not repeated in detail here.

According to some embodiments, when there is a need, the WAC control unit 113 may clear at least one portion (e.g. a portion or all) of word line access count data, and more particularly, clear all information in the (K*N) extraordinary storage cells 110B, to reset the counter values {CNT(0), CNT(1), ..., CNT(K−1)} to be zero. In addition, after the operation of Step S40B is completed, the memory module 100 (e.g. the WAC control unit 113) may clear the counter such as the N-bits counter 116 with an internal reset signal of the memory module 100, for performing counting next time. For example, the one or more control circuits may be implemented by way of control logic circuits, and the internal reset signal may be generated by one or more of the control logic circuits.

Regarding the architecture shown in FIG. 1, the apparatus may comprise the aforementioned at least one memory bank such as the memory bank 110, but the present invention is not limited thereto. According to some embodiments, the memory module 100 may comprise the aforementioned at least one memory bank such as multiple memory banks {110}, and the multiple memory banks {110} may comprise multiple M-bits ordinary page buffers {112}, multiple N-bits extraordinary page buffers {114}, multiple N-bits counters {116} and multiple WAC control units {113}, respectively, and these components of the multiple memory banks {110} may be coupled to one another in the same manner as that of the architecture shown in FIG. 1, respectively, where the apparatus may comprise the multiple memory banks {110}.

According to some embodiments, the architecture shown in FIG. 1 may vary. For example, the N-bits extraordinary page buffer 114 may be replaced with an X-bits extraordinary page buffer, and/or the N-bits counter 116 may be replaced with an X-bits counter, where X may represent a positive integer greater than or equal to N. For another example, the N-bits extraordinary page buffer 114 and the N-bits counter 116 may be replaced with an X-bits extraordinary page buffer and an X-bits counter, respectively (e.g. X≥N). For yet another example, the N-bits extraordinary page buffer 114 and the N-bits counter 116 may be replaced with an X1-bits extraordinary page buffer and an X2-bits counter, respectively, where X1 and X2 may represent positive integers greater than or equal to N (e.g. X2≥X1≥N).

According to some embodiments, the method and the apparatus can utilize the $(k+1)^{th}$ row of extraordinary storage cells at the word line WL<k> (e.g. N extraordinary storage cells per word line) to record the number of access operations of the word line WL<k>, where the counter value CNT(k) may be an integer falling within the interval [0, $2^N$−1]. The counter such as the N-bits counter 116 may be shared among the plurality of word lines such as the K word lines {WL<0>, WL<1>, ..., WL<K−1>} to minimize die size penalty. In comparison with the related art, the present invention method and associated apparatus can enhance overall performance without introducing any side effect or in a way that is less likely to introduce a side effect.

Some implementation details regarding the memory module 200 may be described as follows. The memory module 200 may be taken as an example of the memory module 100. As shown in FIG. 2, the memory module 200 may comprise memory banks 210, 220, ..., and 280, and each of the memory banks 210, 220, ..., and 280 may have the same architecture (e.g. internal components, associated connections, etc.) as that of the memory banks 110 shown in FIG. 1. For example, the memory banks 210, 220, ..., and 280 may comprise storage cells 210SC, 220SC, ..., and 280SC, M-bits ordinary page buffers 212, 222, ..., and 282, N-bits extraordinary page buffers 214, 224, ..., and 284, corresponding counters such as N-bits counters 216, 226, ..., and 286, and word line (WL) access count control units 213, 223, ..., and 283 (which may be referred to as the WAC control units 213, 223, ..., and 283 for brevity), respectively. These components of the memory banks 210, 220, ..., and 280 may be taken as examples of the components of the memory bank 110, respectively.

In addition, the memory module 200 may comprise a central control unit 201 for controlling access of the memory banks 210, 220, ..., and 280 according to external commands, addresses, etc. from the host system, and comprise a word line decoder 202 and a column select line decoder 203 (respectively labeled "WL-Dec" and "CSL-Dec" in FIG. 2 for brevity) for performing row decoding and column decoding under control of the central control unit 201, and further comprise an access circuit 205 comprising read data paths 205R and write data paths 205W, for the host system to read or write the data through external data lines {DQ}. The word line decoder 202 may be coupled to the storage cells 210SC, 220SC, ..., and 280SC through word lines {WL}, the column select line decoder 203 may be coupled to the M-bits ordinary page buffers 212, 222, ..., and 282 through column select lines {CSL} for controlling column switches embedded in the M-bits ordinary page buffers 212, 222, ..., and 282, and the access circuit 205 (e.g. the read data paths 205R and the write data paths 205W) may be coupled to the M-bits ordinary page buffers 212, 222, ..., and 282 through main data lines {MDQ}. For brevity, similar descriptions for this embodiment are not repeated in detail here.

Figure 4:
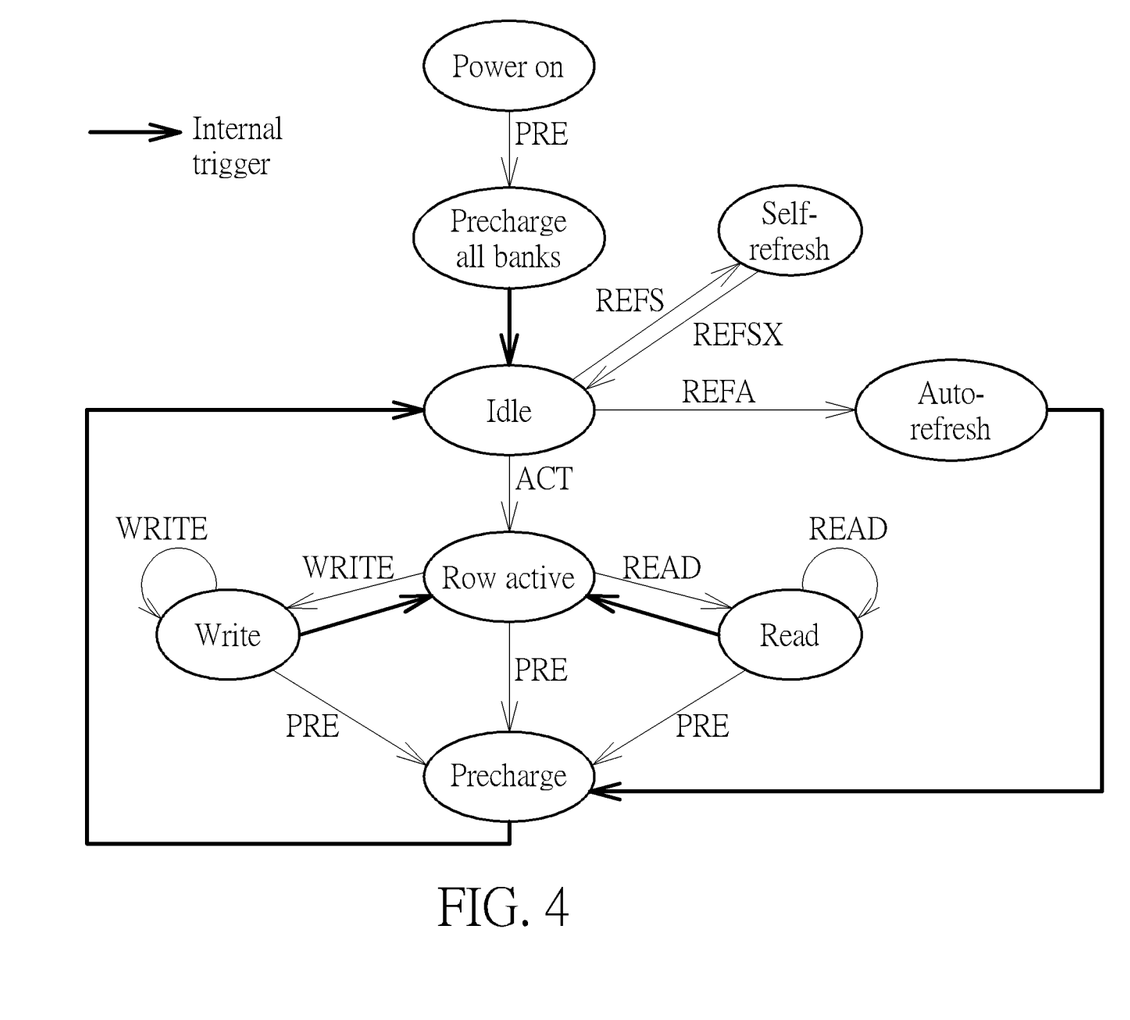
FIG. 4 illustrates a state diagram of the memory module shown in FIG. 2 regarding ordinary storage cells according to an embodiment of the present invention.

FIG. 4 illustrates a state diagram of the memory module 200 shown in FIG. 2 regarding ordinary storage cells according to an embodiment of the present invention, where the arrows depicted with bold lines may indicate state changes caused by internal triggers of the memory module 200. The memory module 200 (e.g. the central control unit 201) may receive one or more commands such as the precharge command PRE, a self-refresh command REFS, an exit self-refresh command REFSX, an auto-refresh command REFA, an activation command ACT, a read command READ, a write command WRITE, etc. from the host system, to operate according to the one or more commands.

As shown in the upper half of FIG. 4, after power on, the memory module 200 may receive the precharge command PRE and then precharge all banks (e.g. the memory banks 210, 220, ..., and 280), and may enter an idle state; when receiving the self-refresh command REFS, the memory module 200 may perform self-refresh (SR) on at least one portion (e.g. a portion or all) of the ordinary storage cells of the memory banks 210, 220, ..., and 280 in an self-refresh state; when receiving the exit self-refresh command REFSX, the memory module 200 may control the ordinary storage cells to exit from the self-refresh state; and when receiving the auto-refresh command REFA, the memory module 200 may perform auto-refresh (AR) on a portion of the ordinary storage cells of the memory banks 210, 220, ..., and 280 in an auto-refresh state, and precharge the portion of the ordinary storage cells in a precharge state shown in the bottommost of FIG. 4 and then enter the idle state.

As shown in the lower half of FIG. 4, when receiving the activation command ACT, the memory module 200 may activate a corresponding row of storage cells in a certain bank (e.g. any of the memory banks 210, 220, ..., and 280) in a row active state, for example, through a certain active word line of this bank; when receiving the read command READ, the memory module 200 may read one or more sets of data from the ordinary page buffer of this bank (e.g. a corresponding M-bits ordinary page buffer of the M-bits ordinary page buffers 212, 222, ..., and 282) in the read state; when receiving the write command WRITE, the memory module 200 may write one or more sets of data to the ordinary page buffer of this bank (e.g. the corresponding M-bits ordinary page buffer of the M-bits ordinary page buffers 212, 222, ..., and 282) in the write state; and when receiving the precharge command PRE, the memory module 200 may precharge this row of storage cells in the precharge state and then enter the idle state.

Figure 5A:
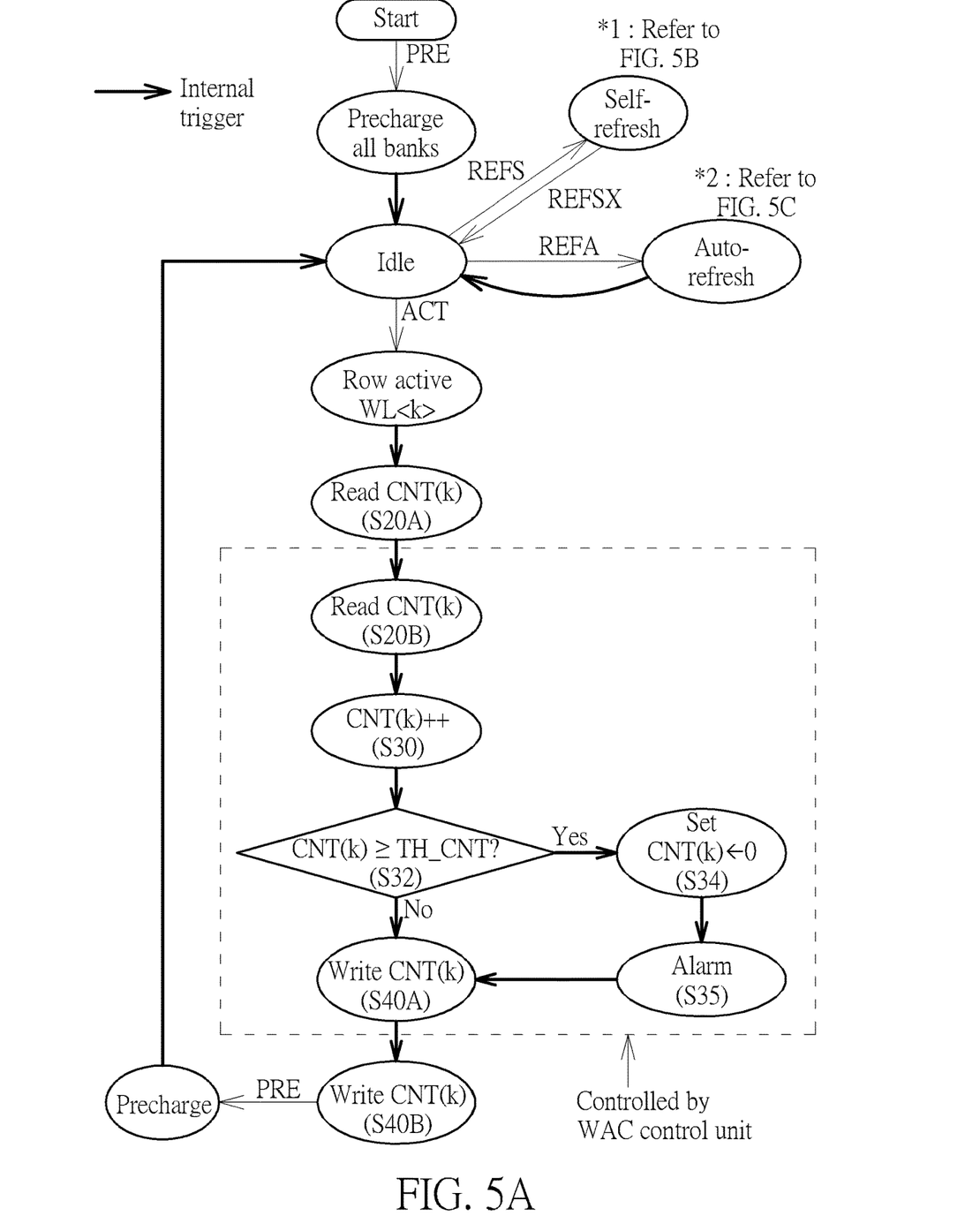
FIG. 5A illustrates a state diagram of the memory module shown in FIG. 2 regarding extraordinary storage cells according to an embodiment of the present invention.
Figure 5B:
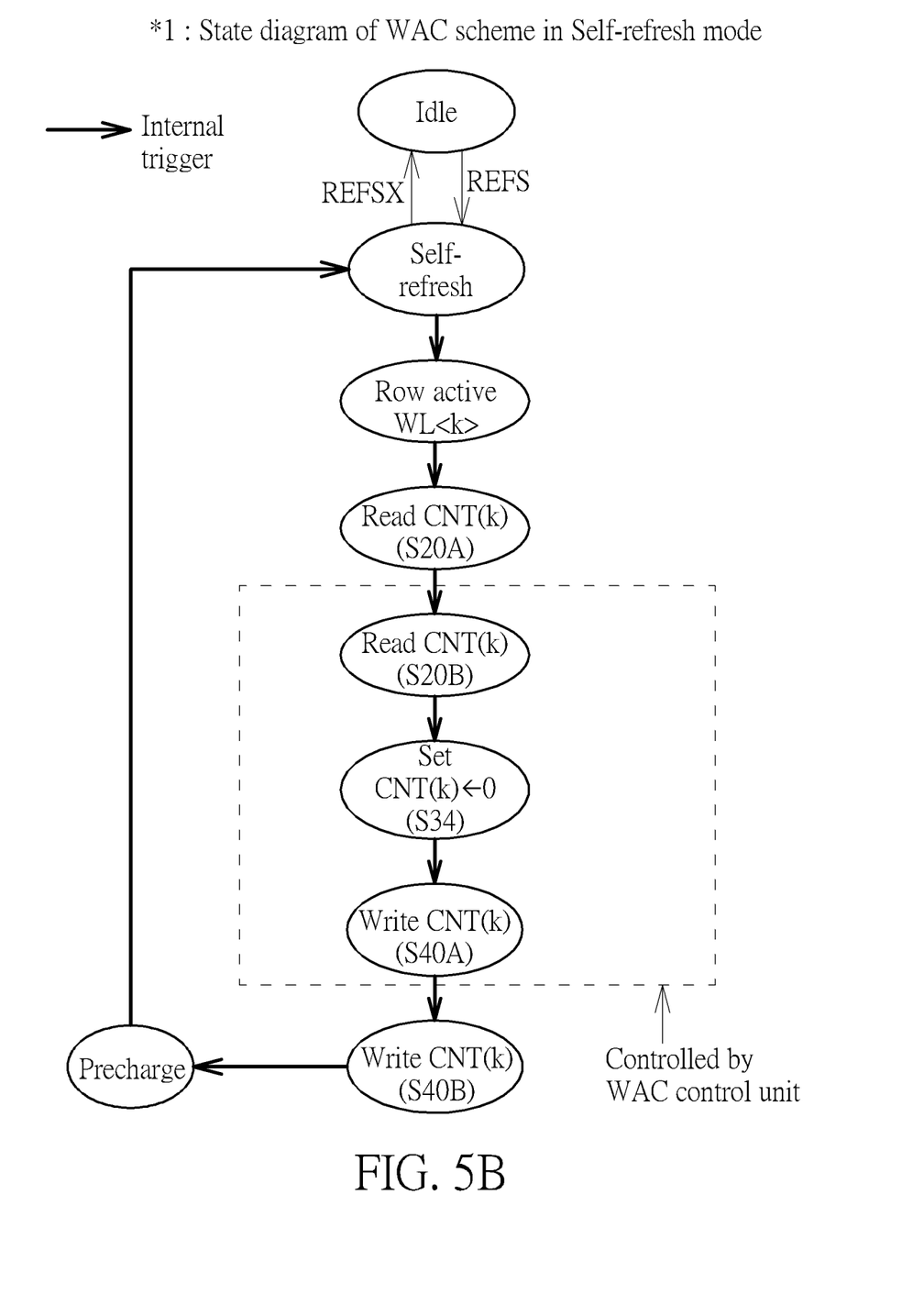
FIG. 5B illustrates some implementation details regarding self-refresh in the state diagram shown in FIG. 5A.
Figure 5C:
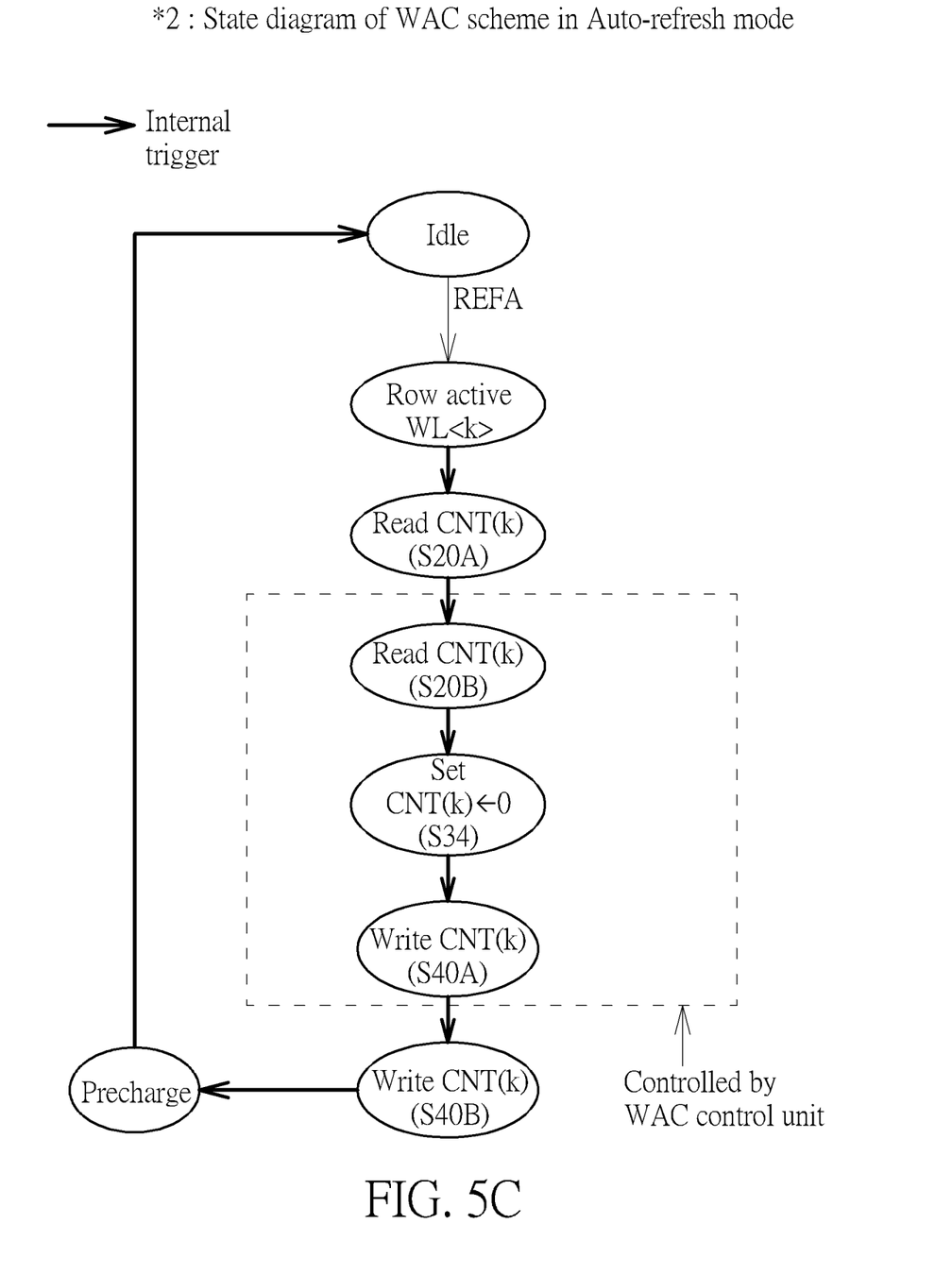
FIG. 5C illustrates some implementation details of regarding auto-refresh in the state diagram shown in FIG. 5A.

FIG. 5A illustrates a state diagram of the memory module 200 shown in FIG. 2 regarding extraordinary storage cells according to an embodiment of the present invention, and FIGS. 5B-5C illustrate some implementation details regarding self-refresh (SR) and auto-refresh (AR) in the state diagram shown in FIG. 5A, respectively, where the self-refresh (SR) and the auto-refresh (AR) shown in FIG. 5A are respectively labeled "*1: Refer to FIG. 5B" and "*2: Refer to FIG. 5C" to indicate referring to FIG. 5B and FIG. 5C for further details thereof, and the arrows depicted with bold lines may indicate state changes caused by internal triggers of the memory module 200. The memory module 200 (e.g. the central control unit 201) may receive the one or more commands, and may notify the WAC control units 213, 223, ..., and 283 of the one or more commands when there is a need, for example, the operation of precharging all banks (e.g. the memory banks 210, 220, ..., and 280) and the operation of precharging the row of storage cells in the precharge state may be the same as that shown in FIG. 4, but the present invention is not limited thereto. As shown in the block illustrated with dashed lines in each of FIGS. 5A-5C, any (e.g. each) WAC control unit of the WAC control units 213, 223, ..., and 283 may operate automatically without being triggered by any external command from the host system (labeled "No external command" for brevity), to control a series of operations of the memory module 200, and more particularly, may control the series of operations (e.g. switch from one state to another state in the block for multiple states regarding the series of operations) according to self-timing controlled by itself and complete all operations of the series of operations in a minimum row active time tRAS (which may be referred to as minimum tRAS for brevity). For example, the minimum row active time tRAS may correspond to 35 nanoseconds (ns) for a certain type of DRAM. For better comprehension, some symbols, etc. of the working flow shown in FIG. 3 may be labeled in some of the states in the block, but the present invention is not limited thereto.

As shown in FIG. 5A, when the memory module 200 receives the activation command ACT and activates the corresponding row of storage cells of the aforementioned bank (e.g. the aforementioned any of the memory banks 210, 220, . . . , and 280) in the row active state, the WAC control unit may automatically switch from the row active state to subsequent states, and more particularly, enter a read state of the extraordinary storage cells at the active word line (e.g. the word line being accessed) such as the word line WL<k> in this bank, to start performing at least one portion (e.g. a portion or all) of the operations of Steps S20A-S40B shown in FIG. 3. For example, during reading out the set of bit information (e.g. the N bits of word line access count data) such as the counter value CNT(k), the operations of Steps S20A and S20B may be performed (labeled "Read CNT(k) (520A)" and "Read CNT(k) (520B)" for brevity); afterward, the operation of Step S30 may be performed to update the counter value CNT(k) (e.g. CNT(k)++), and then the operation of Step S32 may be performed to obtained a determination result thereof (e.g. "Yes" or "No" in FIG. 3), where the operations of Step S34 and S35 may be selectively performed according to the determination result; and during writing the set of updated bit information (e.g. the N bits of updated word line access count data) such as the counter value CNT(k) that has just been updated, the operations of Steps S40A and S40B may be performed (labeled "Write CNT(k) (540A)" and "Write CNT(k) (540B)" for brevity).

FIG. 5B may be regarded as a state diagram of a WAC scheme of the method in the self-refresh mode. As shown in FIG. 5B, when the memory module 200 switches from the idle state to the self-refresh state, the self-refresh command REFS may automatically activate a row of storage cells in any bank (e.g. the memory banks 210, 220, . . . , and 280) in a row active state, for example, through a certain active word line of this bank (e.g. the word line WL<k>), and more particularly, perform a portion of the operations of Steps S20A-S40B shown in FIG. 3 (e.g. the operations of Steps S20A, S20B, S34, S40A and S40B) for this word line, and then precharge this row of storage cells in a precharge state, and may further repeat these operations for the next row of storage cells until the exit self-refresh command REFSX is received.

FIG. 5C may be regarded as a state diagram of the WAC scheme of the method in the auto-refresh mode. As shown in FIG. 5C, when the memory module 200 switches from the idle state to the auto-refresh state, the auto-refresh command REFA may automatically activate a row of storage cells in any bank (e.g. the memory banks 210, 220, . . . , and 280) in a row active state, for example, through a certain active word line of this bank (e.g. the word line WL<k>), and more particularly, perform a portion of the operations of Steps S20A-S40B shown in FIG. 3 (e.g. the operations of Steps S20A, S20B, S34, S40A and S40B) for this word line, and then precharge this row of storage cells in a precharge state. For brevity, similar descriptions for this embodiment are not repeated in detail here.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for operating a memory, comprising:
providing a plurality of word lines and a plurality of extraordinary storage cells coupled to the plurality of word lines; and
utilizing the plurality of extraordinary storage cells to accumulate and store respective access counts of the plurality of word lines, wherein multiple sets of extraordinary storage cells in the plurality of extraordinary storage cells correspond to the plurality of word lines, respectively;
resetting an access count of a refreshing word line to an initial value in response to an auto-refresh operation or a self-refresh operation applied to the refreshing word line regardless of an instant value of the access count.

2. The method of claim 1, further comprising:
in response to any word line of the plurality of word lines being accessed, reading out a set of bit information in a set of extraordinary storage cells at said any word line, wherein the memory comprises the plurality of extraordinary storage cells comprising the set of extraordinary storage cells;
utilizing a counter to update a counter value indicated by the set of bit information to generate an updated counter value, wherein the updated counter value which belongs to a refreshing word line is generated by resetting the counter value to the initial value during an auto-refresh operation or a self-refresh operation; and
writing a set of updated bit information indicating the updated counter value back to the set of extraordinary storage cells at said any word line, to be an updated value of an access count of said any word line.

3. The method of claim 2, wherein the memory further comprises a plurality of extraordinary bit lines that are coupled to the plurality of extraordinary storage cells, and comprises an extraordinary page buffer that is coupled to the plurality of extraordinary storage cells through the plurality of extraordinary bit lines; and the method further comprises:
utilizing the extraordinary page buffer to latch the set of bit information, for being loaded into the counter to be the counter value;
wherein:
reading out the set of bit information in the set of extraordinary storage cells at said any word line further comprises:
utilizing the counter to read the set of bit information from the extraordinary page buffer, wherein cell signals carrying the set of bit information are transmitted from the set of extraordinary storage cells at said any word line to the plurality of extraordinary bit lines by charge sharing, and the set of bit information is latched by the extraordinary page buffer; and
writing the set of updated bit information indicating the updated counter value back to the set of extraordinary storage cells at said any word line to be the updated value of the access count of said any word line further comprises:
utilizes the counter to write the set of updated bit information indicating the updated counter value to the extraordinary page buffer, for writing the set of updated bit information back to the set of extraordinary storage cells at said any word line, wherein the extraordinary page buffer drives the set of updated bit information indicating the updated counter value back to the set of extraordinary storage cells at said any word line through the plurality of extraordinary bit lines, to be the updated value of the access count of said any word line, and cell signals carrying the set of updated bit information are transmitted from the plurality of extraordinary bit lines to the set of extraordinary storage cells at said any word line.

4. The method of claim 2, further comprising:
utilizing a word line access count (WAC) control unit of the memory to operate automatically without being triggered by any external command from a host system, to control a series of operations of the memory, wherein the series of operations comprise an operation of updating the counter value indicated by the set of bit information to generate the updated counter value, and an operation of writing the set of updated bit information indicating the updated counter value back to the set of extraordinary storage cells at said any word line to be the updated value of the access count of said any word line.

5. The method of claim 1, further comprising:
during an auto-refresh operation or a self-refresh operation, periodically resetting the access counts corresponding to all the word lines, to the initial value in sequence regardless of the instant value of the counter.

6. A memory, comprising:
a plurality of world lines;
a plurality of extraordinary storage cells, coupled to the plurality of word lines, arranged to accumulate and store respective access counts of the plurality of word lines, wherein multiple sets of extraordinary storage cells in the plurality of extraordinary storage cells correspond to the plurality of word lines, respectively; and
a word line access count (WAC) control unit, arranged to reset an access count of a refreshing word line to an initial value in response to an auto-refresh operation or a self-refresh operation applied to the refreshing word line regardless of an instant value of the access count.

7. The memory of claim 6, wherein the memory further comprises:
a counter, coupled to the plurality of extraordinary storage cells, arranged to perform counting; and
wherein the WAC control unit is coupled to the counter, and is arranged to in response to any word line of the plurality of word lines being accessed, control the counter to read out a set of bit information in a set of extraordinary storage cells at said any word line; the counter updates a counter value indicated by the set of bit information to generate an updated counter value; and the WAC control unit is arranged to trigger writing a set of updated bit information indicating the updated counter value back to the set of extraordinary storage cells at said any word line, to be an updated value of an access count of said any word line; wherein the WAC control unit generates the updated counter value which belongs to the refreshing word line by resetting the counter value during the auto-refresh operation or the self-refresh operation.

8. The memory of claim 7, wherein the memory further comprises:
a plurality of extraordinary bit lines, coupled to the plurality of extraordinary storage cells; and
an extraordinary page buffer, coupled to the plurality of extraordinary storage cells through the plurality of extraordinary bit lines, wherein the extraordinary page buffer latches the set of bit information, for being loaded into the counter to be the counter value;
wherein:
during reading out the set of bit information, the WAC control unit utilizes a counter to read the set of bit information from the extraordinary page buffer, wherein cell signals carrying the set of bit information are transmitted from the set of extraordinary storage cells at said any word line to the plurality of extraordinary bit lines by charge sharing, and the set of bit information is latched by the extraordinary page buffer; and
during writing the set of updated bit information, the WAC control unit utilizes the counter to write the set of updated bit information indicating the updated counter value to the extraordinary page buffer, for writing the set of updated bit information back to the set of extraordinary storage cells at said any word line, wherein the extraordinary page buffer drives the set of updated bit information indicating the updated counter value back to the set of extraordinary storage cells at said any word line through the plurality of extraordinary bit lines, to be the updated value of the access count of said any word line, and cell signals carrying the set of updated bit information are transmitted from the plurality of extraordinary bit lines to the set of extraordinary storage cells at said any word line.

9. The memory of claim 7, wherein the WAC control unit operates automatically without being triggered by any external command from a host system, to control a series of operations of the memory, wherein the series of operations comprise an operation of updating the counter value indicated by the set of bit information to generate the updated counter value, and an operation of writing the set of updated bit information indicating the updated counter value back to the set of extraordinary storage cells at said any word line to be the updated value of the access count of said any word line.

10. The memory of claim 9, wherein the WAC control unit completes all operations of the series of operations in a minimum row active time.

11. The memory of claim 6, wherein the WAC control unit controls a series of operations of the memory according to self-timing controlled by itself.

* * * * *